(12) United States Patent
Rijssemus

(10) Patent No.: US 8,058,948 B2
(45) Date of Patent: Nov. 15, 2011

(54) SIGNAL SPLITTER WITH IMPROVED TRANSMISSON LINE TRANSFORMER

(75) Inventor: Martien Rijssemus, Heelsum (NL)

(73) Assignee: Technetix Group Limited, Burgress Hill (West Sussex) (GB)

( * ) Notice: Subject to any disclaimer, the term of this patent is extended or adjusted under 35 U.S.C. 154(b) by 222 days.

(21) Appl. No.: 12/321,270

(22) Filed: Jan. 16, 2009

(65) Prior Publication Data

US 2009/0189709 A1    Jul. 30, 2009

(30) Foreign Application Priority Data

Jan. 16, 2008 (GB) .................................. 0800730.4

(51) Int. Cl.
*H03H 7/38* (2006.01)
*H03H 7/42* (2006.01)
(52) U.S. Cl. ........... 333/124; 333/24 R; 333/25; 333/26; 333/32; 333/131
(58) Field of Classification Search .............. 333/24 R, 333/25, 26, 32, 124, 131; 725/127, 149; 348/E7.053
See application file for complete search history.

(56) References Cited

U.S. PATENT DOCUMENTS

| | | | | |
|---|---|---|---|---|
| 3,454,905 | A | * | 7/1969 | Winegard ..................... 333/131 |
| 4,031,540 | A | * | 6/1977 | Borys, Jr. ..................... 343/860 |
| 4,631,504 | A | * | 12/1986 | Matsuda et al. ................ 333/25 |
| 4,647,868 | A | * | 3/1987 | Mueller ......................... 330/286 |
| 4,774,481 | A | 9/1988 | Edwards | |
| 4,814,730 | A | * | 3/1989 | Via et al. ....................... 333/119 |
| 5,017,886 | A | * | 5/1991 | Geller ........................... 330/277 |
| 5,172,082 | A | * | 12/1992 | Livingston et al. ............. 333/26 |
| 5,347,245 | A | 9/1994 | Wright | |
| 5,767,754 | A | * | 6/1998 | Menna ........................... 333/25 |
| 6,578,202 | B1 | 6/2003 | Holland | |
| 2006/0061431 | A1 | 3/2006 | London | |
| 2007/0063787 | A1 | 3/2007 | Rauch | |

FOREIGN PATENT DOCUMENTS

| | | |
|---|---|---|
| EP | 0200884 A | 11/1986 |
| JP | 2002/217670 A1 | 8/2002 |
| WO | WO-00/57547 A1 | 9/2000 |

OTHER PUBLICATIONS

UK Intellectual Property Office; Search Report for Application No. GB0800730.4, May 22, 2008.
PCT International Search Report for Application No. PCT/GB2009/050007; completed Apr. 30, 2009; mailed May 11, 2009.
McClure D.A., Broadband Transmission Line Transformer Family Matches a Wide Range of Impedances, Part 1; RF Design (Overland Park, KS), Feb. 1, 1994, pp. 62, 64-66.
McClure D.A., Broadband Transmission Line Transformer Family Matches a Wide Range of Impedances, Part 2; RF Design (Overland Park, KS), May 1, 1995, pp. 40, 42, 44-46, 48-49.

* cited by examiner

*Primary Examiner* — Robert Pascal
*Assistant Examiner* — Kimberly Glenn
(74) *Attorney, Agent, or Firm* — Abelman, Frayne & Schwab

(57) ABSTRACT

A splitter circuit for use in a CATV network. A signal input communicates with a first balun to supply two signal outputs, wherein the first balun is impedance matched to the impedance of the input using two or more additional baluns in parallel with each other. The additional baluns are transmission line baluns in parallel or series with resistive and/or capacitive and/or inductive components.

3 Claims, 2 Drawing Sheets

SIGNAL SPLITTER WITH IMPROVED TRANSMISSON LINE TRANSFORMER

BACKGROUND OF THE INVENTION

1. Field of the Invention

This invention relates to a splitter circuit means, in particular a splitter circuit means within a cable television network.

2. Description of the Related Art

Cable television networks use signal splitters to divide a main signal so as to provide a number of separate signal outputs for individual users. Conventional splitters used in such networks rely on transformers to match the impedance of the input signal with the impedance of an electrical element which splits the signal. However, in certain applications, the transformer affects the quality of the signal transmitted to the user outputs.

It is an aim of the present invention to provide a signal splitter means which does not use a transformer.

SUMMARY OF THE INVENTION

According to the invention, there is provided a splitter circuit means for use in a CATV network comprising a signal input in communication with a first balun (balanced to unbalanced converter) to supply two signal outputs, wherein the balun is impedance matched to the impedance of the input using two or more additional baluns in parallel with each other. The additional baluns remove the need for a transformer to achieve impedance matching.

Typically, the signal splitter means will be within a cable tap unit which splits an incoming signal from a cable television network into a plurality of signals for onward transmission to individual users. The tap units may comprise 4, 8, 16, 24, 36 outlets, with a first balun and at least two additional baluns associated with each pair of outputs.

The additional baluns may be in parallel or series with resistive and/or capacitive and/or inductive components. This allows the impedance matching to be further adjusted.

Preferably each balun is a transmission line balun.

BRIEF DESCRIPTION OF THE DRAWINGS

The invention will now be described, by way of example, with reference to the following figures in which.

DETAILED DESCRIPTION OF THE INVENTION

Figure 1:
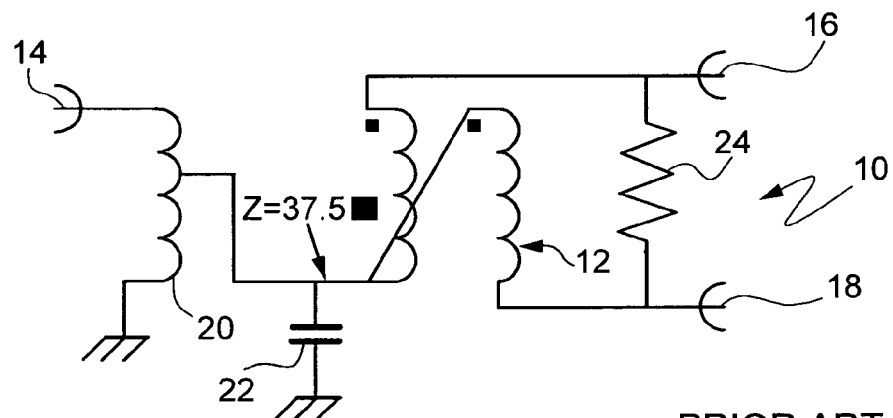
FIG. 1 shows a prior art signal splitter.

FIG. 1 shows a splitter circuit 10 used in existing cable television communication networks. This is basic splitter building block and is typical of a two-way 75Ω RF splitter.

Splitters with more outputs can be built using a plurality of the same building block. Thus with four outputs, two such basic circuits would be used. The basic splitter comprises a balun (balanced to unbalanced converter) 12 which splits the signal from an input to provide separate signals to two customer outputs 16, 18. Thus one balun 12 is associated with two outputs 16, 18. An auto-transformer 20 is placed in series between the input 14 and the balun 12. The impedance at the centrepoint of the balun 12 is half of the input and output impedances and in the case of a cable TV splitter is 37.5Ω.

The auto-transformer 20 is used to match the impedance at the centrepoint of the balun 12 to that of the impedance associated with the input 14. A capacitor 22 and resistor 24 are also included to assist with impedance matching. The auto-transformer has a reasonable bandwidth if not too many windings are used and generally an auto-transformer with seven windings and a tap on five windings wound round on a suitable ferrite core is used.

The use of the auto-transformer 20 limits the maximum possible signal bandwidth. If one wishes to achieve a wider bandwidth by using a transformer with four windings with a tap on three windings, the impedance matching is worse.

Figure 2:
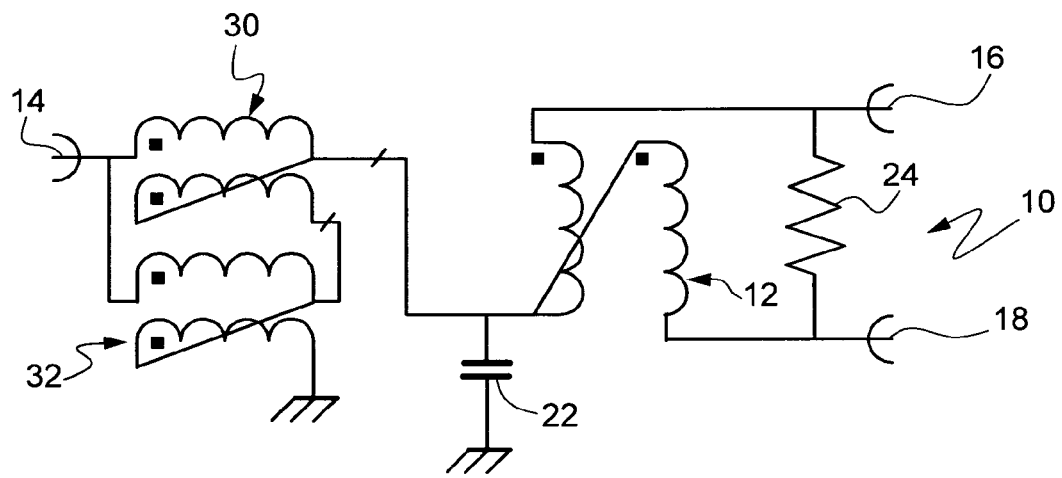
FIGS. 2 and 3 show a signal splitter circuit in accordance with the present invention.

A splitter circuit according to the present invention as shown in FIG. 2 does not rely on an auto-transformer to obtain impedance matching. Instead, two baluns 30, 32 are used to obtain proper matching. In FIG. 2, two transmission line baluns 30, 32 are placed in parallel with each other between the input 14 and the balun 12 used to split the signal between two separate user outputs 16, 18. Suitable baluns are typically made from one or two bifilar windings wound on a ferrite core. However, the two baluns could be wound on a single ferrite core.

Figure 3:
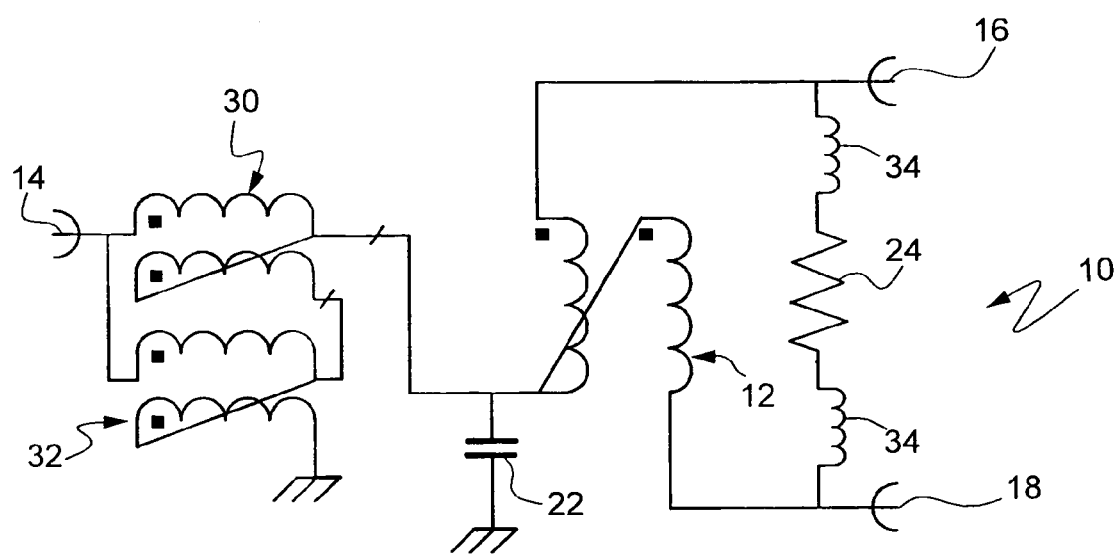

The two baluns 30, 32 at the input are configured as a 75Ω to 42Ω impedance transformer, with the 42Ω close to the ideal 37.5Ω impedance that is theoretically needed to impedance match with the splitter balun 12. A capacitor 22 in parallel with the splitter balun 12 and connected to earth, and a resistor 24 connected in parallel with the splitter balun are used to refine the impedance match. The value of the capacitor 22 depends on the actual physical dimension of the baluns and needed bandwidth. A typical value for the resistor is 150Ω although this can be adjusted to achieve best performance. As shown in the embodiment of FIG. 3, small inductors 34 can be placed in series with the resistor 24 to obtain best performance at higher frequencies.

The splitter circuit of the present invention provides good impedance matching over the range 5 MHz up to 3 GHz, a wider bandwidth than is possible with conventional splitters using auto-transformers.

What is claimed is:

1. A splitter circuit means for use in a CATV network comprising a signal input in communication with a first balun to supply two signal outputs, the first balun impedance matched to the impedance of the input using two or more additional baluns in parallel with each other, wherein the two or more additional baluns are in parallel or series with resistive and/or capacitive and/or inductive components.

2. A splitter circuit means according to claim 1, wherein the baluns are transmission line baluns.

3. A cable television network incorporating one or more splitter circuit means in accordance with claim 1.

* * * * *